(12) United States Patent
Marumoto et al.

(10) Patent No.: US 9,953,840 B2
(45) Date of Patent: Apr. 24, 2018

(54) SUBSTRATE PROCESSING METHOD AND SUBSTRATE PROCESSING SYSTEM

(71) Applicant: Tokyo Electron Limited, Tokyo (JP)

(72) Inventors: Hiroshi Marumoto, Kumamoto (JP); Hisashi Kawano, Kumamoto (JP); Hiromi Kiyose, Kumamoto (JP); Mitsunori Nakamori, Kumamoto (JP); Kazuyuki Mitsuoka, Kumamoto (JP)

(73) Assignee: Tokyo Electron Limited, Tokoy (JP)

( * ) Notice: Subject to any disclaimer, the term of this patent is extended or adjusted under 35 U.S.C. 154(b) by 0 days.

(21) Appl. No.: 15/371,707

(22) Filed: Dec. 7, 2016

(65) Prior Publication Data

US 2017/0186620 A1    Jun. 29, 2017

(30) Foreign Application Priority Data

Dec. 25, 2015  (JP) .................. 2015-254198

(51) Int. Cl.
| | |
|---|---|
| H01L 21/302 | (2006.01) |
| H01L 21/461 | (2006.01) |
| H01L 21/3065 | (2006.01) |
| H01L 21/02 | (2006.01) |
| H01L 21/306 | (2006.01) |
| H01L 21/311 | (2006.01) |
| H01L 21/324 | (2006.01) |
| H01L 21/67 | (2006.01) |

(52) U.S. Cl.
CPC .... *H01L 21/3065* (2013.01); *H01L 21/02057* (2013.01); *H01L 21/30604* (2013.01); *H01L 21/31111* (2013.01); *H01L 21/31116* (2013.01); *H01L 21/324* (2013.01); *H01L 21/6704* (2013.01); *H01L 21/67069* (2013.01); *H01L 21/67075* (2013.01)

(58) Field of Classification Search
USPC ........................................ 438/704
See application file for complete search history.

(56) References Cited

FOREIGN PATENT DOCUMENTS

| | | | |
|---|---|---|---|
| JP | 2010-045389 A | 2/2010 | |
| JP | 2011-009537 A | 1/2011 | |

*Primary Examiner* — Roberts Culbert
(74) *Attorney, Agent, or Firm* — Abelman, Frayne & Schwab

(57) ABSTRACT

A substrate processing method according to the present disclosure includes: a liquid processing process of supplying a processing liquid to a substrate having a surface on which a pattern having a plurality of convex portions is formed; a drying process of removing the processing liquid existing on the surface of the substrate dry the substrate, and a separating process of separating a sticking portion between adjacent ones of the convex portions after the drying process.

11 Claims, 4 Drawing Sheets

SUBSTRATE PROCESSING METHOD AND SUBSTRATE PROCESSING SYSTEM

CROSS-REFERENCE TO RELATED APPLICATIONS

This application is based on and claims priority from Japanese Patent Application No. 2015-254198 filed on Dec. 25, 2015 with the Japan Patent Office, the disclosure of which is incorporated herein in its entirety by reference.

TECHNICAL FIELD

The present disclosure relates to a technology of restoring a deformed convex portion of a pattern after removing a processing liquid supplied to a substrate to dry the substrate.

BACKGROUND

A semiconductor device manufacturing process includes liquid processings such as, for example, a wet etching and a chemical liquid cleaning. The liquid processing includes a chemical liquid processing process of supplying a chemical liquid to a substrate such as a wafer, a rinsing process of supplying a rinse liquid (e.g., deionized water) to the substrate to remove the chemical liquid and a reaction product, a replacing process of replacing the deionized water on the substrate with a dry organic solvent having a higher volatility and a lower surface tension than those of the deionized water, with, for example, isopropyl alcohol (IPA), and a drying process of drying the organic solvent (see, e.g., Japanese Patent Laid-Open Publication No. 2010-045389)

Especially, when a pattern with a high aspect ratio is formed on a substrate, a phenomenon may be caused in which convex portions (columnar portions) at the opposite sides of a concave portion are deformed to bring the tip ends of the convex portions to be in contact with each other, due to the surface tension of the liquid (e.g., the rinse liquid) when the liquid moves out of the concave portion. The occurrence of the deformation of the convex portions may be suppressed by performing the drying process after replacing the deionized water that has penetrated into the pattern with IPA. However, it is difficult to thoroughly suppress the occurrence of the deformation of the convex portions.

SUMMARY

An exemplary embodiment of the present disclosure provides a substrate processing method including: a liquid processing process of supplying a processing liquid to a substrate having a surface on which a pattern having a plurality of convex portions is formed; a drying process of removing the chemical liquid existing on the surface of the substrate to dry the substrate; and a separating process of separating a sticking portion between adjacent ones of the convex portions after the drying process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
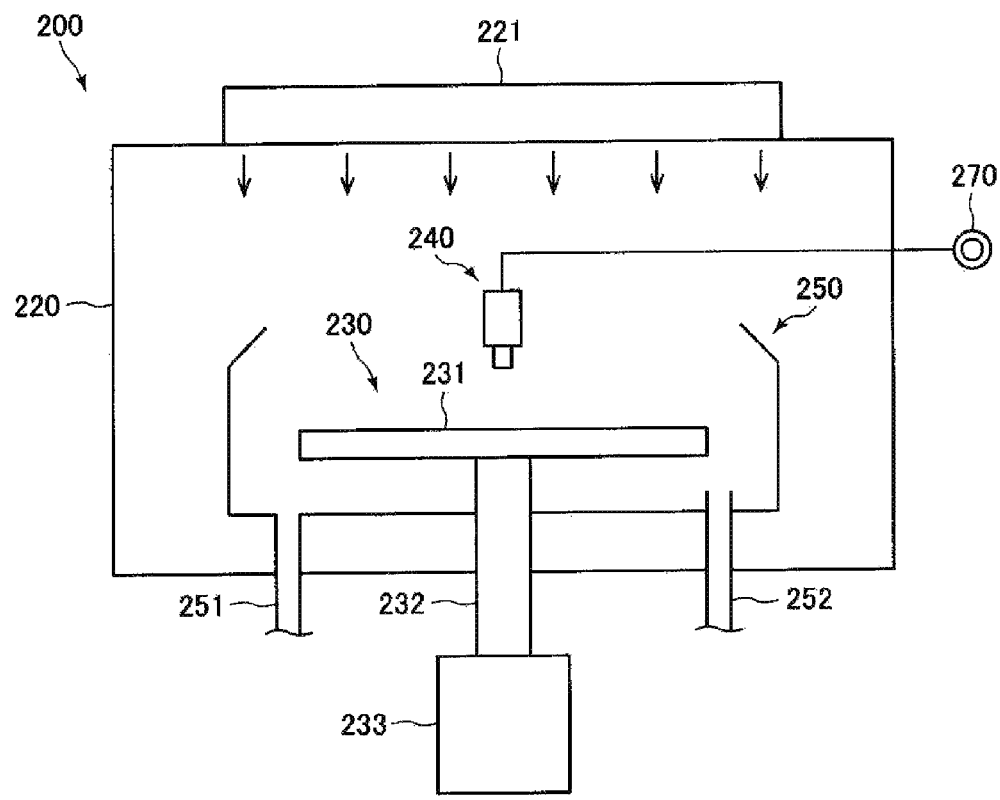
FIG. 1 is a vertical sectional view schematically illustrating a configuration of a liquid processing unit used for a liquid processing process and a drying process.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technology of restoring a deformed convex portion of a pattern.

An exemplary embodiment of the present disclosure provides a substrate processing method including: a liquid processing process of supplying a processing liquid to a substrate having a surface on which a pattern having a plurality of convex portions is formed; a drying process of removing the chemical liquid existing on the surface of the substrate to dry the substrate; and a separating process of separating a sticking portion between adjacent ones of the convex portions after the drying process.

In the above-described substrate processing method, the separating process separates the sticking portion by etching the sticking portion with an etching gas supplied to the substrate.

The above-described substrate processing method further includes a thermal processing process of heating the substrate after the separating process.

In the above-described substrate processing method, the etching gas is a mixture of ammonia gas and hydrogen fluoride gas.

In the above-described substrate processing method, the surfaces of the convex portions where the sticking portion is formed are made of silicon or a silicon oxide.

In the above-described substrate processing method, the liquid processing process includes a chemical liquid processing process of supplying a chemical liquid to the substrate, and a rinsing process of washing the chemical liquid from the surface of the substrate by supplying a rinse liquid to the substrate. The drying process is performed after the rinsing process.

In the above-described substrate processing method, the liquid processing process includes: a chemical liquid processing process of supplying a chemical liquid to the substrate; a rinsing process of washing the chemical liquid from the surface of the substrate by supplying a rinse liquid to the substrate; and a replacing process of replacing the rinse liquid on the surface of the substrate with a solvent having a higher volatility than that of the rinse liquid by supplying the solvent to the substrate. The drying process is performed after the replacing process.

Another exemplary embodiment of the present disclosure provides a substrate processing system including a liquid processing apparatus that supplies a processing liquid to a substrate having a surface on which a pattern having a plurality of convex portions is formed, and then, dries the substrate, and a separating apparatus that separates a sticking portion between adjacent ones of the convex portions of the substrate by supplying an etching gas to the substrate processed by the liquid processing apparatus and etching the sticking portion of the convex portions.

According to the exemplary embodiments of the present disclosure, when the sticking portion is separated, the sticking convex portions are restored by an elastic force so that the convex portions are returned to the state prior to the deformation. That is, the deformed convex portions of the pattern are restored. This enables the manufacturing yield of a semiconductor device to be improved.

Hereinafter, the exemplary embodiments of the present disclosure will be described with reference to the drawings.

The substrate processing method includes at least the following processes:

(1) a liquid processing process of supplying a processing liquid to a substrate having a surface on which a pattern having a plurality of convex portions is formed, (2) a drying process of removing the chemical liquid existing on the surface of the substrate to dry the substrate, and (3) a separating process of separating a sticking portion between adjacent ones of the convex portions after the drying process.

First, the liquid processing process and the drying process will be described. The liquid processing process and the drying process may be performed by a liquid processing unit 200 schematically illustrated in FIG. 1.

As illustrated in FIG. 1, the liquid processing unit 200 includes a chamber 220, a substrate holding mechanism 230, a processing fluid supply unit 240, and a recovery cup 250. The chamber 220 accommodates the substrate holding mechanism 230, the processing fluid supply unit 240, and the recovery cup 250. A fan filter unit 221 provided on the ceiling of the chamber 220 forms a downflow within the chamber 220.

The substrate holding mechanism 230 may be configured with a spin chuck. The substrate holding mechanism 230 includes a substrate holder 231, a shaft 232, and a driving unit 233 provided with a rotation motor such as, for example, an electric motor. The substrate holding mechanism 230 may rotate a wafer W held horizontally by the substrate holder 231 around the vertical axis.

The processing fluid supply unit 240 includes one or more nozzles that supply a processing fluid such as, for example, a processing liquid or a processing gas to the wafer W. The nozzle is moved by a nozzle arm (not illustrated).

Examples of the processing liquid supplied from the processing fluid supply unit 240 include dilute hydrofluoric (DHF) acid, any chemical liquid used for manufacturing a semiconductor device (e.g., SC-1), a rinse liquid (e.g., deionized water (DIW)), and an organic solvent having a higher volatility and preferably a lower surface tension than those of the rinse liquid (e.g., IPA). Examples of the processing gas supplied from the processing fluid supply unit 240 include nitrogen gas and dry air. Each of the various types of processing fluids is supplied from its corresponding processing fluid supply mechanism 270.

The recovery cup 250 is disposed to surround the substrate holder 231, and collects the processing liquid scattered from the wafer W by the rotation of the substrate holder 231. The processing liquid collected by the recovery cup 250 is discharged from a drain port 51 provided on the bottom portion of the recovery cup 250 to the outside of the liquid processing unit 16. An exhaust port 252 is formed on the bottom portion of the recovery cup 250 to discharge the atmosphere within the recovery cup 250 to the outside of the liquid processing unit 200.

Next, the liquid processing process and the drying process performed in the liquid processing unit 200 of FIG. 1 will be briefly described. The liquid processing process includes a chemical liquid processing process, a rinsing process, and a solvent replacement process. The solvent replacement process may be performed as a process integrated with the drying process.

<Chemical Liquid Processing Process>

A wafer W is carried into the liquid processing unit 200 and held horizontally by the substrate holding mechanism 230. The substrate holding mechanism 230 rotates the wafer W around the vertical axis. The rotation of the wafer W is continued until a series of processes performed by the liquid processing unit 200 are ended. When the processing fluid supply unit 240 supplies a chemical liquid to the surface of the rotating wafer W, the chemical liquid processing is performed on the wafer W. The chemical liquid processing may be a processing of removing particles attached to the surface of the wafer W (made of silicon) by SC1.

<Rinsing Process>

Subsequently, the supply of the chemical liquid from the processing liquid supply unit 240 is stopped, and the DIW as a rinse liquid is supplied from the processing fluid supply unit 240 to the center of the surface of the rotating wafer W so that the chemical liquid and a reaction product existing on the surface of the wafer W including the inner surfaces of concave portions of the pattern are washed.

<Solvent Replacing Process>

Subsequently, the supply of the DIW from the processing fluid supply unit 240 is stopped, and an organic solvent (e.g., IPA) is supplied from the processing fluid supply unit 240 to the center of the surface of the rotating wafer W so that the DIW existing on the surface of the wafer W including the inner surfaces of the concave portions of the pattern is replaced with the IPA.

<Drying Process>

Subsequently, the supply of the IPA from the processing fluid supply unit 240 is stopped, and preferably, the rotation speed of the wafer W is increased so as to perform a spin drying of the wafer W. Since the IPA has the higher volatility than that of the DIW, the IPA is quickly dried. Further, since the IPA has the lower surface tension than that of the DIW, the deformation of the convex portions of the pattern is hard to occur in the subsequent drying process. In the drying process, nitrogen gas as a dry gas may be supplied to the surface of the wafer W from the processing fluid supply unit 240. In addition, in the drying process, the drying area may be gradually widened from the center of the wafer W toward the peripheral edge thereof, by causing a collision position of the drying gas on the surface of the wafer W to be gradually moved radially outward.

Figure 2A:
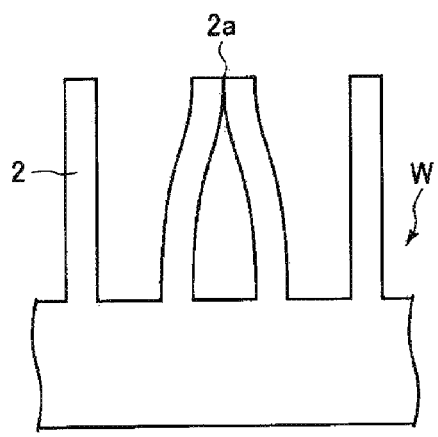
FIGS. 2A and 2B are schematic sectional views of a wafer for explaining a deformation of pattern convex portions.

For example, when the aspect ratio of the pattern is very high, the deformation of the convex portions of the pattern may be occurring after the end of the drying process. The deformation of the convex portions of the pattern may be found by an inspection device using an image analysis technology applied to a semiconductor manufacturing system (a substrate processing system). As illustrated in FIG. 2A, the deformation of the convex portions of the pattern means a collapse of convex portions (columnar portions) 2 that forms the pattern. The deformation of the convex portions 2 is caused as two adjacent convex portions 2 receive a force in the mutually approaching direction due to the surface tension of the liquid when a liquid (e.g., DIW or IPA) moves out of a gap between the two adjacent convex portions 2, i.e., a concave portion of the pattern.

Figure 2B:
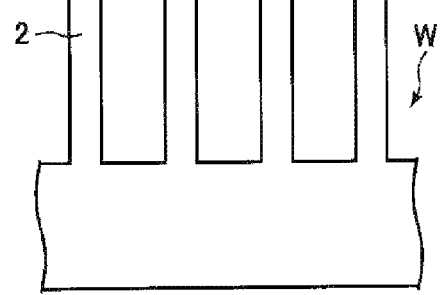

When observing the pattern where the deformation of the convex portions 2 has occurred, the tip ends of the two adjacent convex portions 2 are in close contact with each other as illustrated in FIG. 2A. As a result of the research by the inventors of the present disclosure, it has been discovered that the tip ends of the deformed convex portions 2 stick to each other, and the pattern may be restored to the normal state, that is, the convex portions 2 may be restored to the erected state as illustrated in FIG. 2B by separating (releasing) the portion where the sticking has occurred (a sticking portion 2a). That is, it was discovered that most of the deformed convex portions 2 are merely elastically bent. In addition, the convex portions 2 where a crack or a permanent deformation has occurred may not be restored.

The separation of the sticking portion 2a may be performed by releasing the sticking portion 2a through, for example, a gas chemical etching. This method is specifically effective when the surfaces of the tip ends of the convex portions 2 of the pattern are formed of silicon (Si) or a silicon oxide ($SiO_2$). Although the material of the sticking portion 2a is not clearly identified at the present time, the inventors of the present disclosure believe that the material is a silicon oxide or the like because the method described hereinafter is effective.

Next, descriptions will be made on the substrate processing apparatus used to perform an etching process as the separating process for the pattern restoration and a subsequent thermal processing process, with reference to FIGS. 3 to 5.

<Configuration of Substrate Processing Apparatus>

Figure 3:
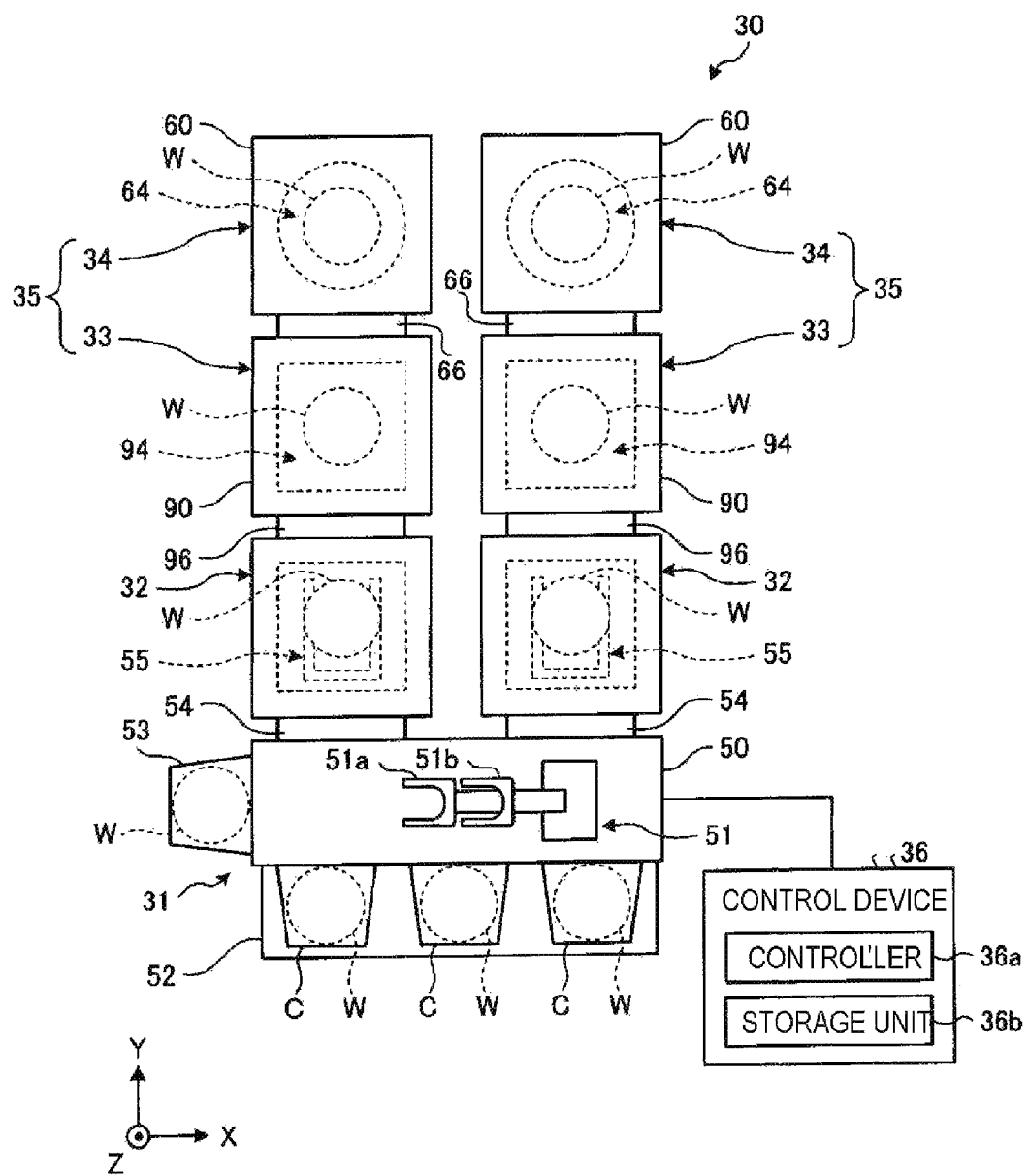
FIG. 3 is a plan view schematically illustrating a configuration of a substrate processing apparatus used for an etching process as a separating process for a pattern restoration.

FIG. 3 is a plan view schematically illustrating a configuration of a substrate processing apparatus 30. In the following, in order to clarify positional relationships, the X-axis, the Y-axis, and the Z-axis which are orthogonal to each other will be defined. The positive Z-axis direction will be regarded as a vertically upward direction.

As illustrated in FIG. 3, the substrate processing apparatus 30 is a gas chemical etching apparatus including a carry-in/out unit 31, a load lock chamber 32, a thermal processing apparatus 33 for performing the thermal processing process, and a removal processing apparatus 34 for performing the etching process as the separating process.

In addition, since an oxide film (a material existing on the sticking portion 2a which is believed as a silicon oxide and a natural oxide film (a silicon oxide) existing on the wafer surface) is removed from the wafer W by the thermal processing apparatus 33 and the removal processing apparatus 34 as described later, the thermal processing apparatus (a heating unit) 33 and the removal processing apparatus (a gas supply unit) 34 constitute an oxide removing unit 35.

Further, the substrate processing apparatus 30 includes a control device 36. The control device 36 is, for example, a computer, and includes a controller 36a and a storage unit 36b. The storage unit 36b stores programs that control the various processings performed in the substrate processing apparatus 30. The controller 36a controls the operation of the substrate processing apparatus 30 by reading and executing the programs stored in the storage unit 36b.

Further, the programs may be recorded in a computer-readable recording medium, and installed from the recording medium to the storage unit 36b of the control device 36. The computer-readable recording medium may be, for example, a hard disc (HD), a flexible disc (FD), a compact disc (CD), a magnet optical disc (MO), or a memory card.

The carry-in/out unit 31 of the substrate processing apparatus 30 includes a transfer chamber 50. A first wafer transfer mechanism 51 is provided inside the transfer chamber 50 to transfer a wafer W. The first wafer transfer mechanism 51 is provided with two transfer arms 51a and 51b each of which transfers a wafer W while holding the wafer W substantially horizontally. Although the example where the two transfer arms 51a and 51b are provided is described, the present disclosure is not limited thereto. The number of the transfer arms may be one (1) or three (3) or more.

The transfer chamber 50 is formed in a substantially rectangular shape in the plan view. A carrier placement table 52 is provided at a lateral side of the transfer chamber 50 in the longitudinal direction thereof (the X-axis direction). In the carrier placement table 52, a plurality of transfer containers (hereinafter, referred to as "carriers C") is arranged to accommodate a plurality of wafers W in the horizontal state. In addition, an orienter 53 is provided at the lateral side of the transfer chamber 50 in the width direction thereof (the Y-axis direction) to position the wafers W.

In the carry-in/out unit 31 configured as described above, wafers W are held by the transfer arms 51a and 51b, and in this state, the wafers W are moved straight or rotated/moved in the horizontal direction, or moved vertically by the driving of the first wafer transfer mechanism 51 so as to be transferred to a desired place. In addition, when the transfer arms 51a and 51b retreat from the carriers C, the orienter 53, or the load lock chamber 32, the wafers W are carried into/out from the carriers C or the load lock chamber 32.

<Configuration of Load Lock Chamber>

Two load lock chambers 32 are provided adjacent to the lateral side of the transfer chamber 50 in the longitudinal direction thereof (the X-axis direction), specifically, the lateral side of the transfer chamber 50 (the positive Y-axis direction side) opposite to the lateral side thereof at which the carrier placement table 52 is provided.

In addition, thermal processing apparatuses 33 are provided adjacent to the load lock chambers 32, respectively. In addition, removal processing apparatuses 34 are provided adjacent to the thermal processing apparatuses 33, respectively. In this way, the load lock chambers 32, the thermal processing apparatuses 33, and the removal processing apparatuses 34 are arranged in series in this order along the Y-axis direction in the substrate processing apparatus 30.

Each load lock chamber 32 is connected to the transfer chamber 50 through a gate valve 54. The load lock chamber 32 is configured to be evacuated to a predetermined degree of vacuum. In addition, a second wafer transfer mechanism 55 is provided inside the load lock chamber 32 to transfer a wafer W.

The second wafer transfer mechanism 55 has, for example, an arm structure having a multi-joint axis and includes a pick that holds the wafer W substantially horizontally. The second wafer transfer mechanism 55 is configured such that the pick is positioned inside the load lock chamber 32 when the arm is in a contracted state, the pick reaches the thermal processing apparatus 33 when the arm is in a stretched state, and the pick reaches the removal processing apparatus 34 when the arm is further stretched. That is, the second wafer transfer mechanism 55 is configured such that the wafer W may be transferred among the load lock chamber 32, the thermal processing apparatus 33, and the removal processing apparatus 34.

<Configuration of Removal Processing Apparatus>

Subsequently, a configuration of the removal processing apparatus 32 will be described with reference to FIG. 4. FIG.

4 is a sectional view schematically illustrating a configuration of the removal processing apparatus 34.

Figure 4:
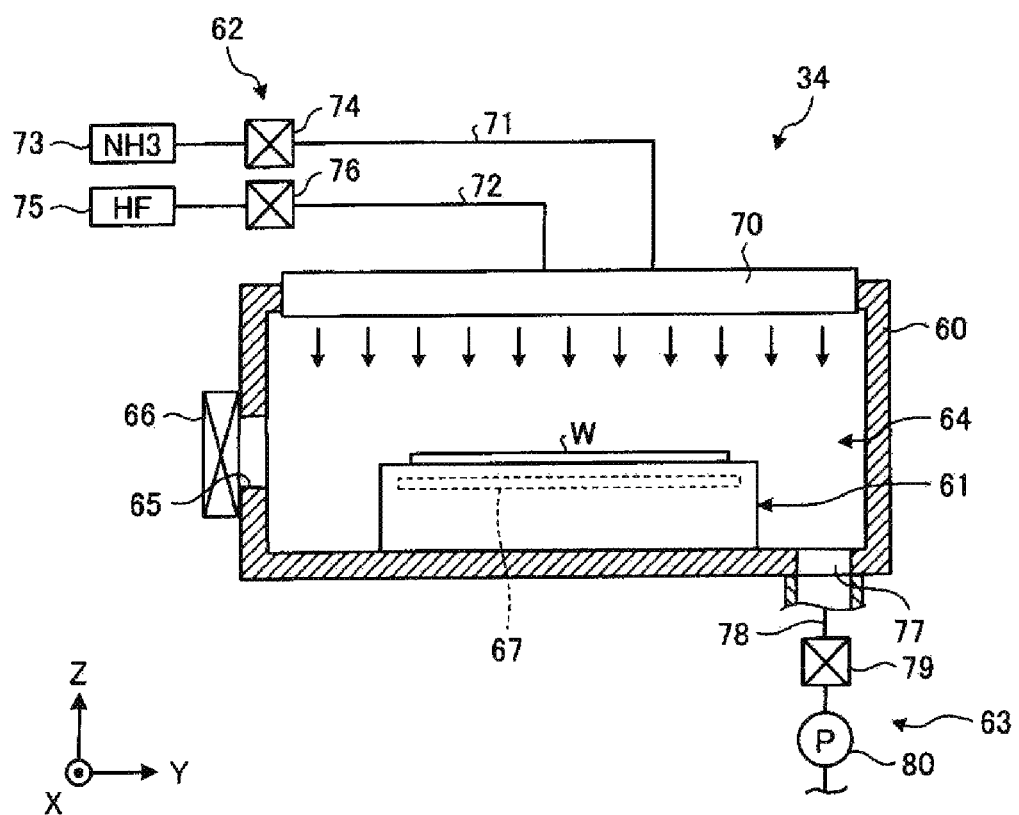
FIG. 4 is a vertical sectional view schematically illustrating a configuration of a removal processing apparatus included in the substrate processing apparatus of FIG. 3.

As illustrated in FIG. 4, the removal processing apparatus 34 includes a chamber 60, a placement table 61, a gas supply mechanism 62, and an exhaust mechanism 63. The chamber 60 has a sealed structure, and a processing chamber (a processing space) 64 is formed inside the chamber 60 to accommodate the wafer W.

In addition, a carry-in/out port 65 is opened on the side wall of the chamber 60 to carry the wafer W into/out from the processing chamber 64. In addition, a gate valve 66 is provided in the carry-in/out port 65 to open and close the carry-in/out port 65.

The placement table 61 is provided at an appropriate position inside the processing chamber 64. The wafer W carried into the chamber 60 from, for example, a cleaning apparatus 20 is placed and held on the placement table 61 in the substantially horizontal state. The placement table 61 is an example of a holding unit.

The placement table 61 is formed in, for example, a substantially circular shape in the plan view and fixed to the bottom portion of the chamber 60. In addition, a temperature regulator 67 is provided at an appropriate position inside the placement table 61 to regulate the temperature of the placement table 61.

The temperature regulator 67 has a pipeline in which a liquid such as, for example, water is circulated. A heat exchange with the liquid flowing in the pipeline is performed so that the temperature of the top surface of the placement table 61 is regulated. Accordingly, a heat exchange is performed between the placement table 61 and the wafer W on the placement table 61 so that the temperature of the wafer W is regulated. In addition, the temperature regulator 67 is not limited to the configuration described above, and may be, for example, an electric heater.

The gas supply mechanism 62 includes a shower head 70, a first gas supply line 71, and a second gas supply line 72.

The shower head 70 is provided in the ceiling of the chamber 60. Further, the shower head 70 has a plurality of ejection holes (not illustrated) to eject a processing gas. The position where the shower head 70 is provided is not limited to the ceiling of the chamber 60, and may be another position such as, for example, the lateral portion of the chamber 60 as long as a processing gas may be supplied to the surface of the wafer W.

One end of each of the first gas supply line 71 and the second gas supply line 72 is connected to the shower head 70. The other end of the first gas supply line 71 is connected to a supply source of ammonia gas which is a kind of the processing gas. In addition, a flow rate regulation valve 74 is provided in the middle of the first gas supply line 71 to open/close the first gas supply line 71 and regulate the supply flow rate of the ammonia gas.

The other end of the second gas supply line 72 is connected to a supply source 75 of hydrogen fluoride gas which is a kind of the processing gas. In addition, a flow rate regulation valve 76 is provided in the middle of the second gas supply line 72 to open/close the second gas supply line 72 and regulate the supply flow rate of the hydrogen fluoride gas.

Accordingly, for example, when the flow rate regulation valves 74 and 76 are opened, the ammonia gas and the hydrogen fluoride gas are diffused and ejected into the processing chamber 64 through the shower head 70.

In the descriptions above, each of the first gas supply line 71 and the second gas supply line 72 is independently connected to the shower head 70. However, the present disclosure is not limited thereto. That is, the first gas supply line 71 and the second gas supply line 72 may be merged with each other, and the merged supply line may be connected to the shower head 70. Further, when the flow rate regulation value is provided in only the merged supply line, the number of components may be reduced.

The exhaust mechanism 63 includes an exhaust path 78 connected to an opening 77 provided on, for example, the bottom portion of the chamber 60. An opening/closing valve 79 is provided in the middle of the exhaust path 78. An exhaust pump 80 is provided in the downstream side of the opening/closing valve 79 to perform a forced exhaust.

The operation of each of the gate valve 66, the temperature regulator 67, the flow rate regulation valves 74 and 76, the opening/closing valve 79, the exhaust pump 80 and others of the removal processing apparatus 34 is controlled by a control command of the above-described control device 36. That is, for example, the supply of the ammonia gas or the hydrogen fluoride gas by the gas supply mechanism 62, the exhaust by the exhaust mechanism 63, and the temperature regulation by the temperature regulator 67 may be controlled by the control device 36.

<Configuration of Thermal Processing Apparatus>

Subsequently, a configuration of the thermal processing apparatus 33 will be described with reference to FIG. 5. FIG. 5 is a view schematically illustrating a configuration of the thermal processing apparatus 33.

Figure 5:
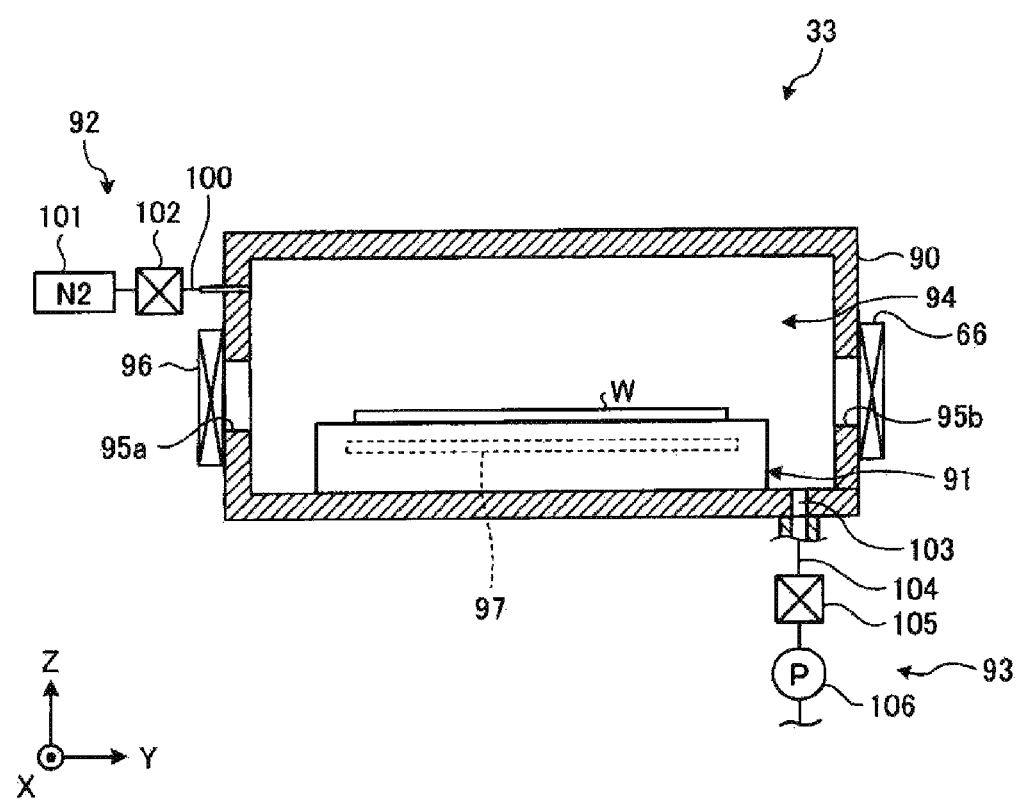
FIG. 5 is a vertical sectional view schematically illustrating a configuration of a thermal processing apparatus included in the substrate processing apparatus of FIG. 3.

As illustrated in FIG. 5, the thermal processing apparatus 33 includes a chamber 90, a placement table 91, a gas supply mechanism 92, and an exhaust mechanism 93. The chamber 90 has a sealed structure, and a processing chamber (a processing space) 94 is formed inside the chamber 90 to accommodate the wafer W.

A carry-in/out port 95a is opened on the wall of the load lock chamber 32 side of the chamber 90 to carry the wafer W in/out from the processing chamber 94. A gate valve 96 is provided in the carry-in/out port 95a to open/close the carry-in/out port 95a. The carry-in/out port 95a is connected to the load lock chamber 32 through the gate valve 96.

In addition, a carry-in/out port 95b is opened on the wall of the removal processing apparatus 34 side of the chamber 90 to carry the wafer W into the processing chamber 94. The above-described gate valve 66 is provided in the carry-in/out port 95b to open/close the carry-in/out port 95b. In addition, the carry-in/out port 95b is connected to the carry-in/out port 65 of the removal processing apparatus 34 through the gate valve 66.

The placement table 91 is provided at an appropriate position inside the processing chamber 94. For example, the wafer W carried into the processing chamber 94 from the thermal processing apparatus 33 is placed and held on the placement table 91 in the substantially horizontal state.

A heater 97 is embedded in the placement table 91. A thermal processing process of heating the wafer W by the heater 97 is performed. The thermal processing will be described in detail later.

The gas supply mechanism 92 includes a third gas supply line 100. One end of the third gas supply line 100 is connected to the processing chamber 94, and the other end thereof is connected to a supply source 101 of nitrogen gas $N_2$ which is a kind of an inert gas. In addition, a flow rate regulation valve 102 is provided in the middle of the third gas supply line 100 to open/close the third gas supply line 100 and regulate the supply flow rate of the nitrogen gas.

The exhaust mechanism 93 includes an exhaust path 104 connected to an opening 103 provided on, for example, the bottom portion of the chamber 90. An automatic pressure control valve 105 is provided in the middle of the exhaust path. An exhaust pump 106 is provided in the downstream side of the automatic pressure control valve 105 to perform a forced exhaust.

The operation of each of the gate valve 96, the heater 97, the flow rate regulation valve 102, the exhaust pump 106, and others of the thermal processing apparatus 33 is controlled by a control command of the above-described control device 36. That is, for example, the supply of the nitrogen gas by the gas supply mechanism 92, the exhaust by the exhaust mechanism 93, and the heating by the heater 97 may be controlled by the control device 36.

<Method of Processing Wafer in Substrate Processing Apparatus>

Next, descriptions will be made on a method of processing the wafer W in the substrate processing apparatus 30 configured as described above, i.e., a pattern restoring method using a gas chemical etching, with reference to FIGS. 3 to 5.

In the substrate processing apparatus 30, the oxide film (the material of the sticking portion 2a) existing on the surface of the wafer W where the convex portions 2 of the pattern are deformed as illustrated in FIG. 2A is removed. Specifically, the wafer W is first accommodated in a carrier C, and transferred to the carrier placement table 52 of the substrate processing apparatus 30.

In the substrate processing apparatus 30, in a state where the gate valve 54 is opened, one wafer W is transferred into the load lock chamber 32 by any one of the transfer arms 51a and 51b of the first wafer transfer mechanism 51 from the carrier C of the carrier placement table 52, and conveyed to the pick of the second wafer transfer mechanism 55.

Then, the gate valve 54 is closed, and the internal space of the load lock chamber 32 is evacuated. Subsequently, the gate valves 66 and 96 are opened, and the pick is stretched up to the removal processing apparatus 34 so that the wafer W is placed on the placement table 61.

Then, the pick is returned to the load lock chamber 32, and the gate valve 66 is closed so that the internal space of the chamber 60 is brought into a sealed state. In this state, while the temperature of the wafer W on the placement table 61 is regulated to a predetermined temperature (e.g., 40° C. to 80° C. higher than the room temperature) by the temperature regulator 67, the ammonia gas and the hydrogen fluoride gas are ejected (supplied) to the wafer W from the gas supply mechanism 62.

Accordingly, the oxide film containing a silicon oxide ($SiO_2$), the ammonia gas, and the hydrogen fluoride gas on the wafer W react with each other as in the following chemical reaction formulas.

$$SiO_2 + 4HF \rightarrow SiF_4 + 2H_2O \quad (1)$$

$$SiF_4 + 2NH_3 + 2HF \rightarrow (NH_4)_2SiF_6 \quad (2)$$

Accordingly, when the oxide film reacts with the ammonia gas and the hydrogen fluoride gas as the processing gas, the oxide film is transformed into a reaction product containing ammonium fluorosilicate ($(NH_4)_2SiF_6$) or water ($H_2O$). Then, the oxide film is removed, and the sticking portion 2a between the tip ends of the convex portions 2 of the pattern is separated (see FIG. 2A) so that the pattern is restored. In addition, the ammonia gas and the hydrogen fluoride gas may be ejected from the shower head 70 toward the wafer W under a decompressed condition (atmosphere). In this case, molecules suppressing the traveling of the ammonia gas and the hydrogen fluoride gas ejected from the shower head 70 to the wafer W are reduced. Accordingly, the ammonia gas and the hydrogen fluoride gas reach the wafer without being obstructed by the molecules suppressing the traveling of the gas. Then, the sticking portion 2a between the tip ends of the convex portions 2 of the pattern may be separated in a short time, as compared to an atmospheric pressure condition. Further, since the amount of the ammonia gas and the hydrogen fluoride gas which reach the wafer W may be increased as compared to that when the ammonia gas and the hydrogen fluoride gas are ejected under the atmospheric pressure condition, the supply amount of the gas may be reduced.

Further, the etching amount of the wafer W may be controlled by regulating the temperature of the wafer W to the predetermined temperature by the temperature regulator 67. When the temperature of the wafer is high, the temperature of the gas also increases as the gas approaches the wafer W. Therefore, the movement of the molecules contained in the gas becomes active so that the molecules are not adsorbed to the wafer W thereby reducing the etching amount. Further, the etching amount by the gas chemical etching is required to be as small as possible within the range assuring that the sticking portion 2a between the tip ends of the convex portions 2 of the pattern (see FIG. 2A) is peeled. To this end, an etching condition where the etching amount is, for example, 15 angstroms or less may be used.

In the descriptions above, the ammonia gas and the hydrogen fluoride gas are supplied to the wafer W at the same time or substantially at the same time. However, the present disclosure is not limited thereto. That is, one of the ammonia gas and the hydrogen fluoride gas may be first supplied to the wafer W, and then, the other may be supplied. In the descriptions above, the ammonia gas and the hydrogen fluoride gas are supplied from the shower head 70 provided on the ceiling of the chamber 60. However, the present disclosure is not limited thereto. The ammonia gas and the hydrogen fluoride gas may be supplied from a nozzle provided with an ejection hole having a smaller diameter than that of the wafer W, and the nozzle may be caused to move along the surface of the wafer W. In addition, when the ammonia gas and the hydrogen fluoride gas react as in the above-described chemical reaction formulas, the ammonia gas and the hydrogen fluoride gas may be supplied to the wafer W under the room temperature and/or the atmospheric pressure.

In the removal processing apparatus 34, a processing of removing the reaction product formed on the surface of the wafer W through heating by the thermal processing apparatus 33 is performed, after the end of the gas supply processing for separating and restoring the pattern.

Specifically, the gate valves 66 and 96 are opened, and the processed wafer W on the placement table 61 is held by the pick of the second wafer transfer mechanism 55. Then, the arm of the second wafer transfer mechanism 55 is contracted, and the wafer W is placed and held on the placement table 91 of the thermal processing apparatus 33. Then, the pick is returned to the load lock chamber 32, and the gate valves 66 and 96 are closed.

Then, nitrogen gas is supplied into the chamber 90, and the wafer W on the placement table 91 is heated to a predetermined temperature (e.g., 100° C. to 200° C.) by the heater 97. As a result, the reaction product formed in the removal processing apparatus 34 is heated and vaporized (sublimated) to be removed as in the following chemical reaction formula (3).

$$(NH_4)_2SiF_6 \rightarrow SiF_4 + 2NH_3 + 2HF \quad (3)$$

As described above, when the thermal processing is performed by the thermal processing apparatus 33 after the gas supply processing in the removal processing apparatus 34, the reaction product formed on the surface of the wafer W in the gas supply processing is removed. Further, the thermal processing may be performed under the decompressed condition.

The wafer W of which the pattern has been restored by the above-described processings is carried out from the substrate processing apparatus 30, and carried into, for example, a film formation apparatus to perform a subsequent processing. Specifically, the gate valves 54 and 96 are opened, and the wafer W is held on the placement table 91 by the pick of the second wafer transfer mechanism 55. Then, the wafer W is conveyed to any one of the transfer arms 51a and 51b of the first wafer transfer mechanism 51 from the pick of the second wafer transfer mechanism 55, and accommodated in a carrier C. The carrier C accommodating the wafer W is transferred to another processing apparatus.

In the descriptions above, the gas supply processing and the thermal processing for the wafer W are performed in their separate chambers 60 and 90. However, the present disclosure is not limited thereto. For example, the processings may be performed within the same chamber.

According to the above-described exemplary embodiments, since an elastically deformed convex portion of an pattern which has been conventionally uniformly recognized as an occurrence of a "pattern collapse" and considered hard to restore, may be restored, the manufacturing yield of a semiconductor device may be improved.

A result of experiments performed to verify the effect of the above-described exemplary embodiments will be briefly described. A wafer formed with a test pattern having a silicon-made convex portion with the line width of 35 nm and the aspect ratio of 13 was prepared. The above-described cleaning processing was performed on the wafer without specifically considering the suppression of the deformation of the convex portion of the pattern so as to obtain the wafer W exhibiting 90.3% with respect to the deformation rate of the convex portion of the pattern (the number of collapsing convex portions/the total number of convex portions of the pattern). Then, when the above-described gas chemical etching processing (the gas supply processing and the thermal processing) was performed, the deformation rate of the convex portions of the pattern decreased even to 7.9%. That is, it was verified that many deformed patterns may be restored according to the above-described method. In addition, for comparison, when ashing by $O_2$ plasma was performed on a wafer exhibiting 89.4% with respect to the deformation rate of the convex portions of the pattern after the cleaning processing, no substantial change occurred in the deformation rate of the convex portions of the pattern. From the result, it is believed that the material of the above-described sticking portion 2a is a silicon oxide or the like.

At the present time, the pattern restoration effect is verified in the case where the tip end of the pattern convex portion is formed of silicon or a silicon oxide, and the ammonia gas and the hydrogen fluoride gas are used as an etching gas. However, the same effect may be expected by using an appropriate etching gas depending on the material of the pattern convex portion, as long as the convex portions of the pattern is merely elastically deformed without being permanently (plastically) deformed or destroyed.

In the above-described exemplary embodiments, the liquid processing process may be performed to hydrophobize the surface of the wafer W. This liquid processing process includes a chemical liquid processing process (SC1), a (DIW) rinsing process, a solvent replacement (IPA replacement) process, a hydrophobization processing process (a processing by a silane coupling agent), a solvent replacement (IPA replacement) process, and a drying process in this order. On the surface of the wafer W prior to the hydrophobization processing process, a chemical oxide film formed by hydrogen peroxide water contained in SC1 or a natural oxide film formed by oxygen in the air is present. On the surface of the wafer W after the hydrophobization processing process, a hydrophobized protecting film is present. However, since the oxide film partially remains, the deformation of the pattern convex portion may occur. Even in this case, the same effect may be expected by applying the ammonia gas and the hydrogen fluoride gas as the etching gas to the pattern concave portion.

A substrate processing system for performing the liquid processing and the drying processing of the wafer W and the separating processing and the thermal processing of the sticking portion of the pattern convex portions may be constructed by the above-described liquid processing unit 200 and substrate processing apparatus 30 (thermal processing apparatus 33 and removal processing apparatus 34). The substrate processing system may be configured as an integrated system where the liquid processing unit 200 and the substrate processing apparatus 30 are stored in one housing. The substrate processing system may be configured with a first substrate processing apparatus that stores units for performing some (e.g., the liquid processing and the drying processing) of the plurality of processings in one housing, and a second substrate processing apparatus that stores units for performing the other (e.g., the separating processing and the thermal processing) of the plurality of processings in one housing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   a liquid processing process of supplying a processing liquid to a substrate having a surface on which a pattern having a plurality of convex portions is formed;
   a drying process of removing the processing liquid existing on the surface of the substrate to dry the substrate; and
   a separating process of separating a sticking portion between adjacent ones of the convex portions after the drying process.

2. The substrate processing method of claim 1, wherein the separating process separates the sticking portion by etching the sticking portion with an etching gas supplied to the substrate.

3. The substrate processing method of claim 2, further comprising a thermal processing process of heating the substrate after the separating process.

4. The substrate processing method of claim 2, wherein the etching gas is a mixture of ammonia gas and hydrogen fluoride gas.

5. The substrate processing method of claim 4, wherein the surfaces of the convex portions where the sticking portion is formed are made of silicon or a silicon oxide.

6. The substrate processing method of claim 1, wherein the liquid processing process includes a chemical liquid processing process of supplying a chemical liquid to the substrate, and a rinsing process of washing the chemical liquid from the surface of the substrate by supplying a rinse liquid to the substrate, and the drying process is performed after the rinsing process.

7. The substrate processing method of claim 1, wherein the liquid processing process includes: a chemical liquid processing process of supplying a chemical liquid to the substrate; a rinsing process of washing the chemical liquid from the surface of the substrate by supplying a rinse liquid to the substrate; and a replacing process of replacing the rinse liquid on the surface of the substrate with a solvent having a higher volatility than that of the rinse liquid by supplying the solvent to the substrate, and the drying process is performed after the replacing process.

8. The substrate processing method of claim 2, wherein the separating process is performed in a decompressed atmosphere.

9. The substrate processing method of claim 2, wherein the etching gas is supplied by moving along the surface of the substrate.

10. The substrate processing method of claim 2, wherein the separating process is performed in the decompressed atmosphere and at a higher temperature than a room temperature.

11. The substrate processing method of claim 1, wherein the liquid processing process includes: a chemical liquid processing process of supplying a chemical liquid to the substrate; a rinsing process of washing the chemical liquid from the surface of the substrate by supplying a rinse liquid to the substrate; and a hydrophobization processing process of forming a hydrophobized protecting film on the substrate.

* * * * *